United States Patent
Khalfin et al.

(10) Patent No.: US 6,459,715 B1
(45) Date of Patent: Oct. 1, 2002

(54) MASTER-OSCILLATOR GRATING COUPLED POWER AMPLIFIER WITH ANGLED AMPLIFIER SECTION

(75) Inventors: Viktor Borisovich Khalfin, Hightstown; Dmitri Zalmanovich Garbuzov, Princeton; Louis Anthony DiMarco, Hamilton Square; John Charles Connolly, Clarksburg, all of NJ (US)

(73) Assignee: Princeton Lightwave, Inc.

( * ) Notice: Subject to any disclaimer, the term of this patent is extended or adjusted under 35 U.S.C. 154(b) by 0 days.

(21) Appl. No.: 09/546,086

(22) Filed: Apr. 10, 2000

Related U.S. Application Data
(60) Provisional application No. 60/133,393, filed on May 10, 1999.

(51) Int. Cl.$^7$ ................................................ H01S 5/00
(52) U.S. Cl. ........................................ 372/50; 372/96
(58) Field of Search .......................... 372/50, 45, 92, 372/96, 102

(56) References Cited

U.S. PATENT DOCUMENTS 5,103,456 A  *  4/1992  Scifres et al. ................. 372/50
5,440,576 A  *  8/1995  Welch et al. ................. 372/50

\* cited by examiner

*Primary Examiner*—Quyen Leung
(74) *Attorney, Agent, or Firm*—Duane Morris LLP; Arthur L. Plevy

(57) ABSTRACT

An apparatus includes a single-mode master-oscillator section and a power amplifier section. The single-mode master-oscillator section includes a waveguide defined by a first end and a second end, the first end including a first distributed Bragg reflector mirror, and the second end including a second distributed Bragg reflector mirror. The single-mode-master-oscillator section also has a first longitudinal axis. The power amplifier section is a broad-contact amplifier coupled to the single-mode-master-oscillator section by a coupling grating that is contained in the waveguide of the single-mode-master-oscillator section. The broad contact amplifier section includes a reflection side, an output side and a second longitudinal axis, the second longitudinal axis being at an angle approximately (90°−β) to said first longitudinal axis, β being in a range between 0° and approximately 20°.

4 Claims, 7 Drawing Sheets

MASTER-OSCILLATOR GRATING COUPLED POWER AMPLIFIER WITH ANGLED AMPLIFIER SECTION

PRIORITY

This application claims the benefit of U.S. Provisional Application Ser. No. 60/133,393, filed May 10, 1999, and U.S. application Ser. No. 09/468,396, both of which are hereby incorporated herein by reference.

FIELD OF THE INVENTION

The present invention relates to semiconductor lasers. In particular, the present invention relates to master oscillator grating coupled power amplifiers (MOGCPAs).

BACKGROUND

Master oscillator power amplifiers (MOPAs), as shown in FIG. 1, typically include a semiconductor Distributed Feedback (DFB) laser diode 101 acting as a master oscillator optically coupled to a tapered optical power amplifier 102. The diode laser and amplifier are essentially a single unit with an integrated optical alignment.

MOPAs are known to have potential to provide both high power and a diffraction-limited single-mode output. MOPA designs that produce a high-power single-mode output, however, have a variety of weaknesses. For example, to achieve a single-mode output, the master-oscillator section of the device is very narrow. This often results in the device exhibiting a large lateral beam divergence, thereby requiring an astigmatic lens for practical use. For example, known MOPA devices can exhibit as much as 15 to 20 degrees beam divergence in the lateral direction, creating at least two problems. First, the divergent beam with a wide output aperture requires complicated focusing optics. Second, the divergent beam propagating in the amplifier section requires an amplifier section with a wide aperture. Since the length of the tapered section must not be shorter than 1 mm to provide the amplification, the output aperture can not be narrower than 50–350 μm. Additionally, known designs also tend to exhibit self-focusing and filamentation problems that limit the level of diffraction-limited power and degrade device stability.

Variations of MOPAs have been conceived, but all contain unacceptable shortcomings.

For example, FIG. 2 is a schematic diagram detailing a Master-Oscillator Deflector-Amplifier Grating for Surface Emission (GSE). In this figure, a laser beam generated in master-oscillator section 201 couples directly into deflector-amplifier section 202, which lies along the same axis as master-oscillator section 201. Deflector-amplifier section 202 contains tilted Bragg grating deflector 204. Deflector-amplifier section 202 is optically coupled to GSE section 203 through tilted grating 204, which scatters the laser beam into GSE section 203. GSE section 203 has a grating that scatters the generated laser beam in the direction perpendicular to the structure plane. Thus, this configuration utilizes three regions, with a coupling grating found inside deflector-amplifier section 202, and light is emitted perpendicular to the direction of propagation through the amplifier section. This apparatus, however, has the drawback that, to maintain single-mode operation, deflector-amplifier amplifier section 202 must be the same width as master-oscillator section 201, thereby limiting output.

FIGS. 3A and 3B is a configuration of the previously-discussed apparatus in which power is amplified by the addition of post amplifier 302. This configuration has the drawback that, because of the refractive index step at the interface between post amplifier 302 and GSE 303, multi-mode lasing in the direction perpendicular to the axes of the deflector-amplifier section occurs.

FIG. 4 is an apparatus that employs the basic design shown in FIG. 2, but includes beam splitters between master-oscillator section 401 and deflector-amplifier sections 402a–402d. The splitters allow for additional GSE sections 403a–403d. Power output is not improved, however, because beam splitters 401a divide the available energy and introduce additional losses.

FIG. 5 is the same as the apparatus discussed in FIG. 2, except that GSE 503 is rotated at an angle Ω relative to deflector-amplifier section 502. This configuration has drawbacks similar to the configuration displayed in FIG. 2.

FIG. 6 displays a variety of embodiments that include laser or lasers 601 and GSE 602. These configurations do not include a broad-contact "power supplying" section, and are not limited to a single-mode output.

Thus, a need exists for a type of MOPA with low lateral beam divergence, and which is stable at high power output with a narrow output aperture.

SUMMARY OF THE INVENTION

To alleviate the problems inherent in known MOPAs, the present invention introduces a master oscillator grating coupled power oscillator (MOGCPA) with a power-oscillator section at an angle to the optical cavity in the master-oscillator section.

In one embodiment of the present invention, the MOGCPA contains a single-mode-master-oscillator section with a waveguide defined by a first end and a second end, the first end including a first distributed Bragg reflector mirror, and the second end including a second distributed Bragg reflector mirror, the single-mode-master-oscillator section having a first longitudinal axis. The MOGCPA additionally contains a broad-contact-amplifier section coupled to said single-mode-master-oscillator section by a coupling grating, said broad contact amplifier section including a reflection side, an output side and a second longitudinal axis, the second longitudinal axis being at an angle approximately (90°−β) to said first longitudinal axis, β being in a range between 0° and approximately 20°.

DETAILED DESCRIPTION

Embodiments of the present invention involve master-oscillator grating-coupled power amplifiers (MOGCPAs) that emit high-powered single-mode light. In general, an angled distributed Bragg reflector cavity design is used. This design suppresses self-focusing effects and filamentation, and decreases the lateral beam divergence. In all the embodiments discussed herein, the gratings discussed must satisfy the Bragg conditions at lasing wavelength.

Figure 7:
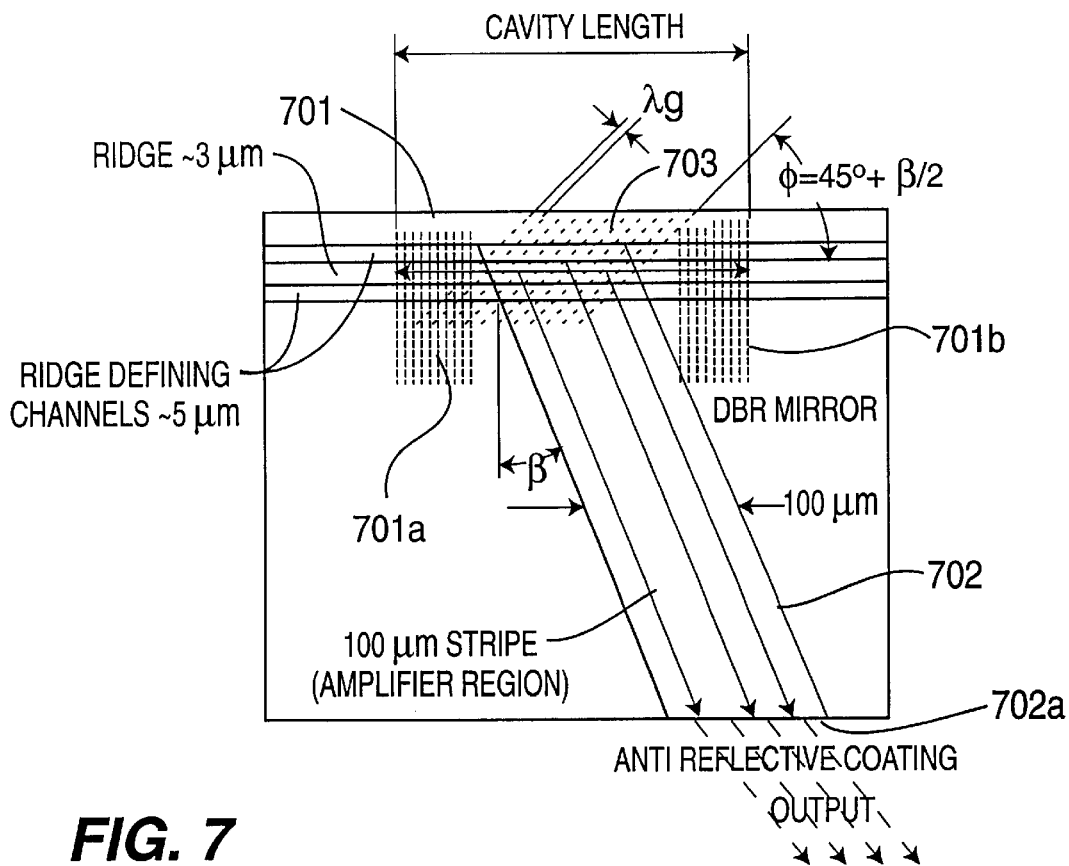
FIG. 7 is a schematic drawing of a cross sectional view of a MOGCPA device, according to an embodiment of the present invention.

Turning now in detail to the drawings, FIG. 7 is a schematic drawing of a MOGCPA according to an embodiment of the present invention. In this figure, master-oscillator section 701 is based on a single-mode distributed Bragg reflector (DBR) ridge-laser. Power amplifier section 702 in this embodiment includes a broad contact amplifier section coupled to the master-oscillator section by DBR grating 703.

Master oscillator section 701 includes an optical cavity with a longitudinal axis defined by DBR mirror 701a and 701b placed along the master oscillator's optical axis.

The MOGCPA in FIG. 7 also includes power-amplifier section 702. Power-amplifier section 702 includes a broad-contact cavity that is coupled to the master oscillator 701 by coupling grating 703. "Broad contact" in this context means that the lateral width of the amplifier section is at least roughly 2 times larger than that for the master oscillator section. The longitudinal axis of power-amplifier section 702 is bounded on one end by coupling grating 703, and on the other end by output face 702a. In one embodiment of the present invention, to achieve a diffraction-limited output divergence of approximately 0.6 degrees, the width of the amplifier section 702 is approximately 100 μm. The output aperture of the power amplifier section 702 (that can be in the range of 5–300 μm) does not depend on the amplifier length, which in one embodiment can have a range of between approximately 1 and approximately 2 mm.

The master oscillator section, in one embodiment of the present invention, can supply seed optical power to the amplifier section that has a distribution approximately matching a quasi-cosine near-field distribution of the broad-contact-amplifier section's zeroth mode.

Power amplifier section 702 is coupled to master oscillator section 701 at an angle to master oscillator section 701. Specifically, the power amplifier's longitudinal axis is placed at an angle approximately (90°−β) to said first longitudinal axis, where β is in a range between 0° and approximately 20°.

Figure 11:
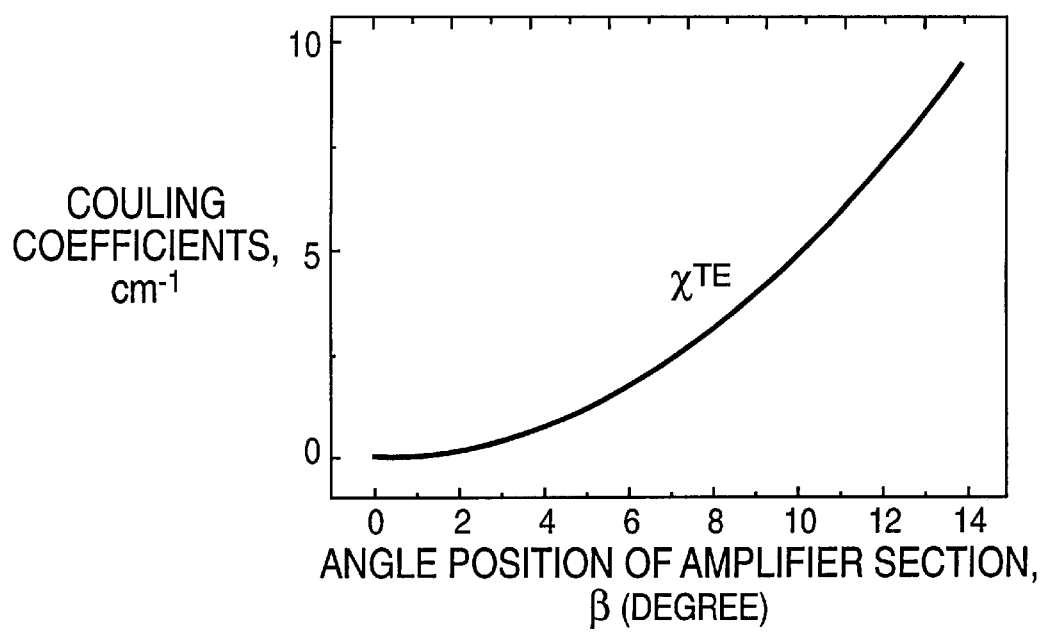
FIG. 11 is a graph of the coupling coefficient for TE-TE coupling as a function of the angle position of the amplifier section.

It should be appreciated by one skilled in the art that the coupling coefficients for TE-to-TE mode coupling from the master oscillator section to the power-amplifier section, and for TE-to-TM coupling from master oscillator section to the power-amplifier section, $\chi^{TE}$ and $\chi^{TM}$, respectively, is dependent on angle β. The angular dependence for TE-TE coupling is shown in FIG. 11. FIG. 11 shows a rapid increase of $\chi^{TE}$ with an increase in the angle β. The maximum value of β is limited by the angle of total internal reflection.

The absolute values of $\chi^{TE}$ and $\chi^{TM}$ depend on the following parameters: (1) the width of the master-oscillator ridge laser (2) the angular position of the grating relative to the axis of the master-oscillator section; (3) the height of the teeth in the coupling grating and (4) the laser's vertical structure. In one embodiment of the present invention, the grating grooves are perpendicular to the bisector of the angle formed by the angle between the axes of the MO and PA sections. Thus, referring to FIG. 7, the grating angle φ equals 45°+β/2. The vertical distribution of the refractive index in the laser structure determines the vertical near-field distribution for the mode, which in turn affects the values of $\chi^{TE}$ and $\chi^{TM}$.

In one embodiment of the present invention, the coupling grating can have a period that is related to the wavelength λ of the light produced in the master-oscillator section according to the following formula:

$$\Lambda = \lambda/(2n \, \text{Sin}(45° + \beta/2)).$$

Thus, for a wavelength λ of 0.97 μm, and an index of refraction n of 3.6, the grating period will be approximately 0.2 μm.

The grating can be made by any way known in the art. For example, the grating can be fabricated using reactive ion beam etching, or can be fabricated using ion beam etching.

Figure 8:
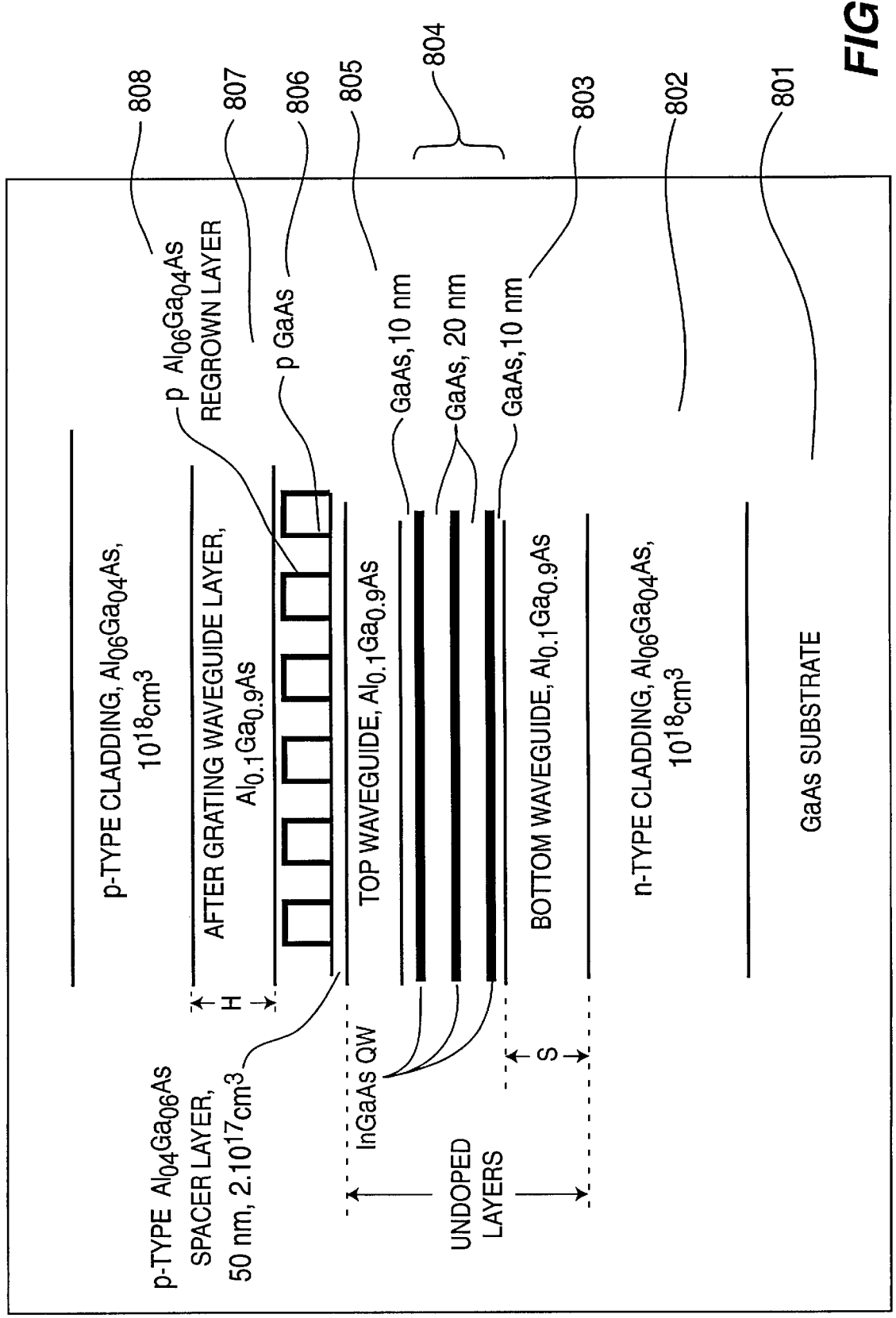
FIG. 8 is a schematic diagram of a cross section of a semiconductor laser used as the master-oscillator section of a MOGCPA device, according to an embodiment of the present invention.

FIG. 8 is a schematic diagram of a cross section of a semiconductor laser used as the master-oscillator section of a MOGCPA device, according to an embodiment of the present invention. The semiconductor laser contains substrate 801 on which consecutive layers of various materials are grown.

In the embodiment shown in FIG. 8, an n-type cladding 802 is grown on substrate 801. This n-type cladding can be any n-type cladding known to be suitable for such a semiconductor laser. For example, n-type cladding 802 can include a compound of aluminum gallium arsenide. This n-type cladding can include $Al_{0.6}Ga_{0.4}As$ with an electron concentration of $10^{18}$ cm$^{-3}$.

On top of n-type cladding lies bottom waveguide 803. Bottom waveguide 803, can be any waveguide material known to be suitable for such lasers. For example, in one embodiment of the present invention, bottom waveguide 803 can include an aluminum gallium arsenide compound. For example, bottom waveguide 803 can include $Al_{0.1}Ga_{0.9}As$.

A series of quantum wells 804 are grown on top of bottom waveguide 803. These quantum wells can be any material known to be suitable for such a purpose. For example, in one embodiment of the present invention, these quantum wells can be InGaAs quantum wells, distributed between layers of GaAs that have a thickness of 10 and 20 nm, as shown in FIG. 8.

Top waveguide 805 is grown on the quantum well layers. Top waveguide 805, in one embodiment of the present invention, is identical to bottom waveguide 803, but can be any material known in the art to be suitable for such a laser.

Figure 9:
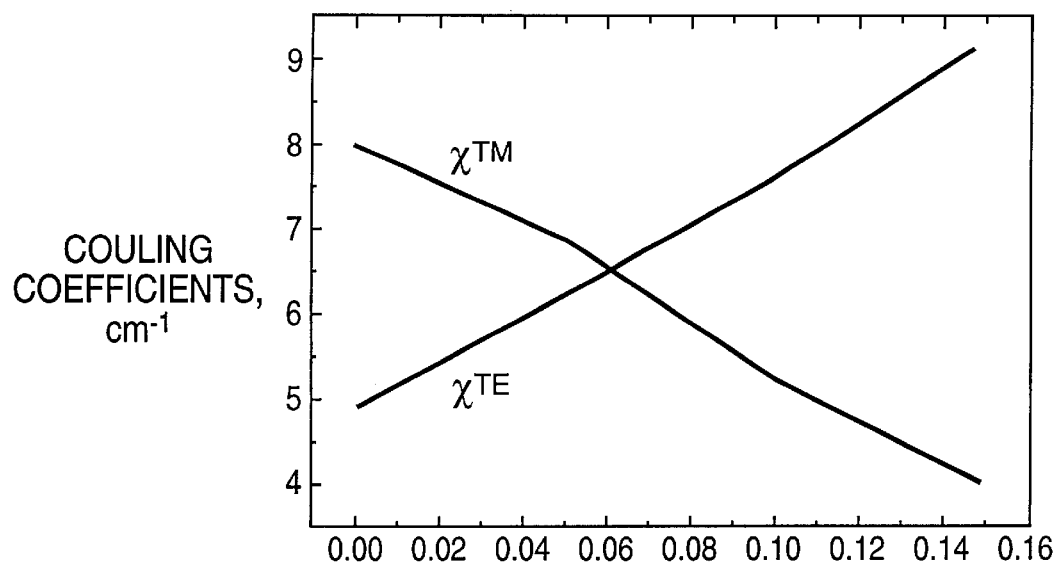
FIG. 9 is a graph of the coupling coefficients as a function of the thickness of the aftergrating layer.

On top waveguide 805, grating 8is shown schematically. Grating 806 is, in one embodiment of the present invention, inside the waveguide. The grating can be made from any materials practicable to make a grating. For example, in FIG. 8 grating 806 is formed GaAs and $Al_{0.6}Ga_{0.4}As$ Aftergrating layer 807 is grown on top of grating layer 806. This aftergrating layer can be within a range of thicknesses between 0.05 and 0.15 μm. The thickness of the aftergrating layer affects the coupling coefficients for TE and TM modes coupled from the MO section into the power-amplifier section of the device, as shown in FIG. 9. In one embodiment of the present invention, the aftergrating layer should not exceed 0.15 μm to avoid vertical non-zero modes being generated during the device's operation. At the maximum tolerable thickness 0.15 μm, the value of $\chi^{TE}$ is doubled and $\chi^{TM}$ is halved in comparison with an arrangement having no aftergrating layer.

On top of aftergrating layer 807 is p-type cladding 808. This cladding can be any practicable p-type cladding. For example, p-type cladding can contain $Al_{0.6}Ga_{0.4}As$ or $In_{0.48}Ga_{0.52}P$ with a hole concentration of $10^{18}$ cm$^{-3}$.

In one embodiment of the present invention, the laser structure has an asymmetric waveguide with a "bottom" part of approximately 0.15 μm thickness, and with a "top" waveguide part 0.05 μm thick, and adjacent to the grating. It should be appreciated that the terms "top" and "bottom" are used in relation to the drawings, and do not necessarily imply a definite spatial direction in fabrication or use. Additionally, it should be appreciated by one skilled in the art that, although a specific sequence of grown layers is shown in FIG. 9, the layers can be grown in any order practicable. For example, the n-type cladding and p-type cladding shown in FIG. 8 can be exchanged with each other.

The laser can be made by any method known in the art. For example, AlGaAs or InGaPAs growth technology can be used.

Figure 10:
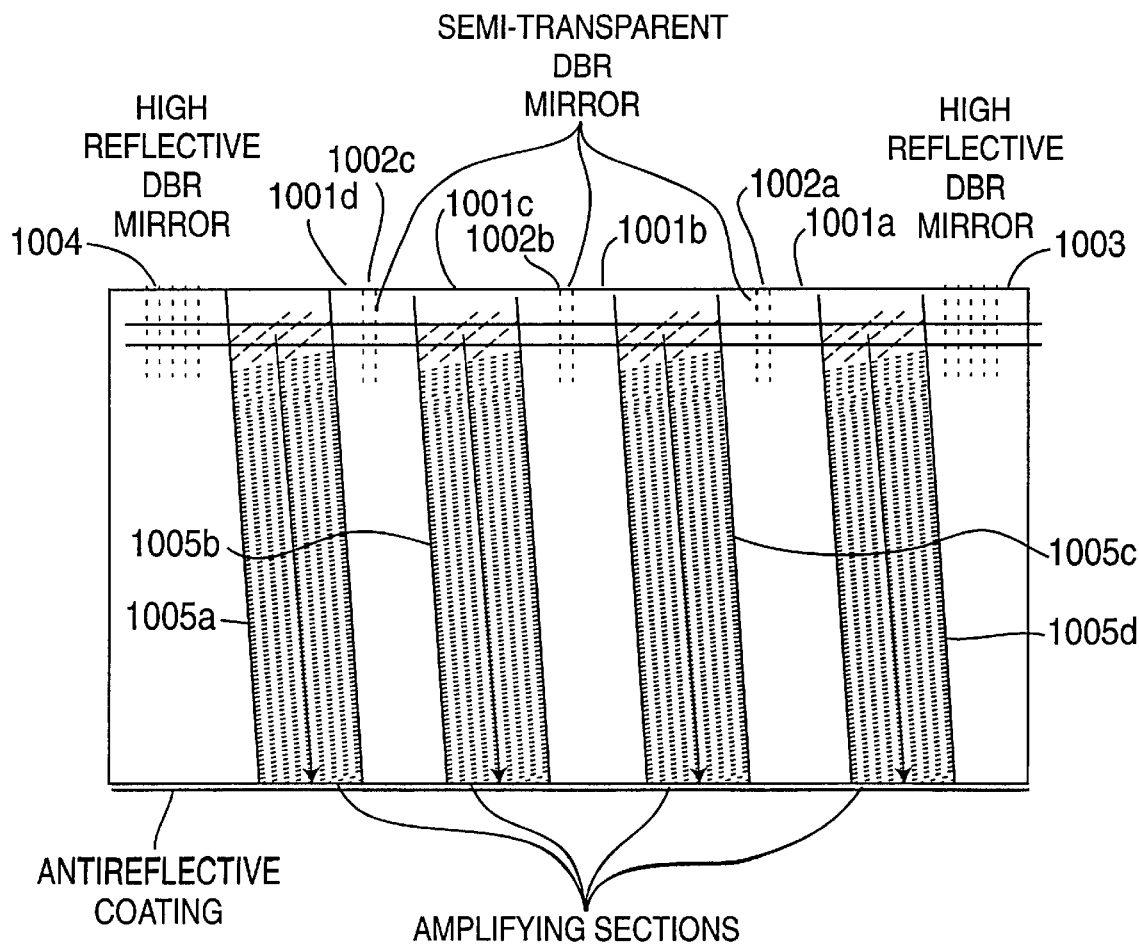
FIG. 10 shows a schematic diagram of a phase-locked array of MOGCPA devices.

FIG. 10 shows a schematic diagram of a phase-locked array of MOGCPA devices with angled PA sections, according to one embodiment of the present invention. As shown in FIG. 10, the master-oscillator section of the apparatus contains semiconductor laser 1001 that has a waveguide divided into subsections 1001a, 1001b, 1001c and 1001d. The subsections are defined by semi-transparent DBR mirrors 1002a, 1002b and 1002c. Thus, the entire master-oscillator section has a structure that is defined at one end by DBR mirror 1003, and at another end by DBR mirror 1004. Between the two ends, the master-oscillator contains semi-transparent mirrors 1002a through 1002c. End DBR mirrors have a reflectivity that is high relative to semitransparent mirrors 1002a through 1002c. One skilled in the art would appreciate that the phase locked array can contain an arbitrary number of subsections; four are displayed in FIG. 10 for convenience only, and are labeled 1005a through 1005d.

Each subsection 1001a through 1001d is coupled to a power amplifier section as discussed above by a coupling grating.

Figure 1:
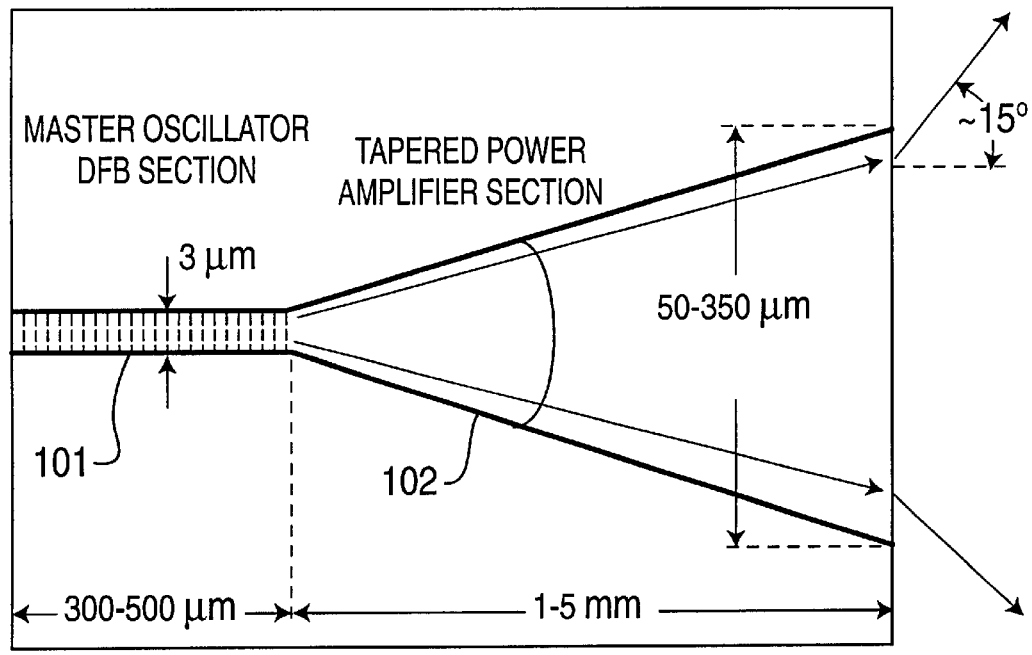
FIG. 1 is a schematic drawing of a cross sectional view of a known MOPA device.
Figure 2:
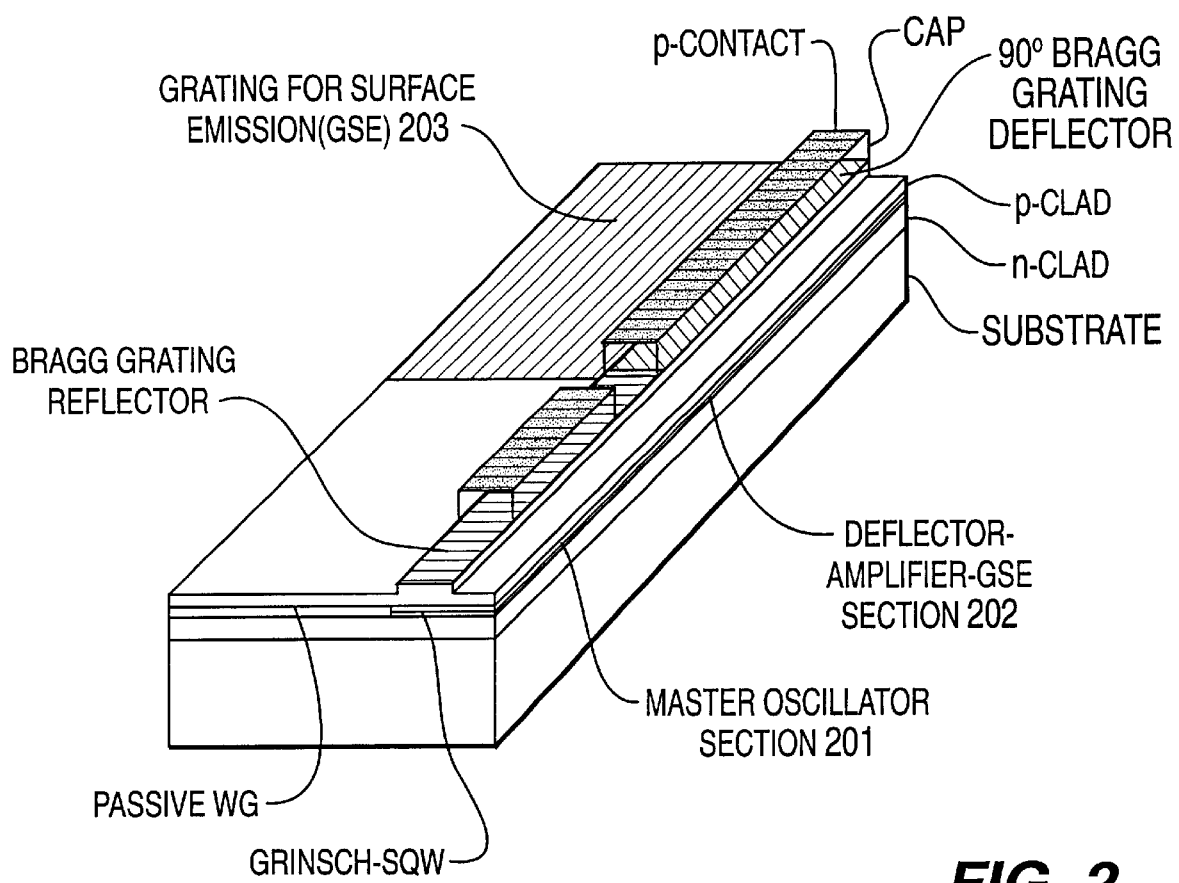
FIG. 2 is a schematic drawing of an apparatus previously contemplated by the inventors' employer.
Figure 3A:
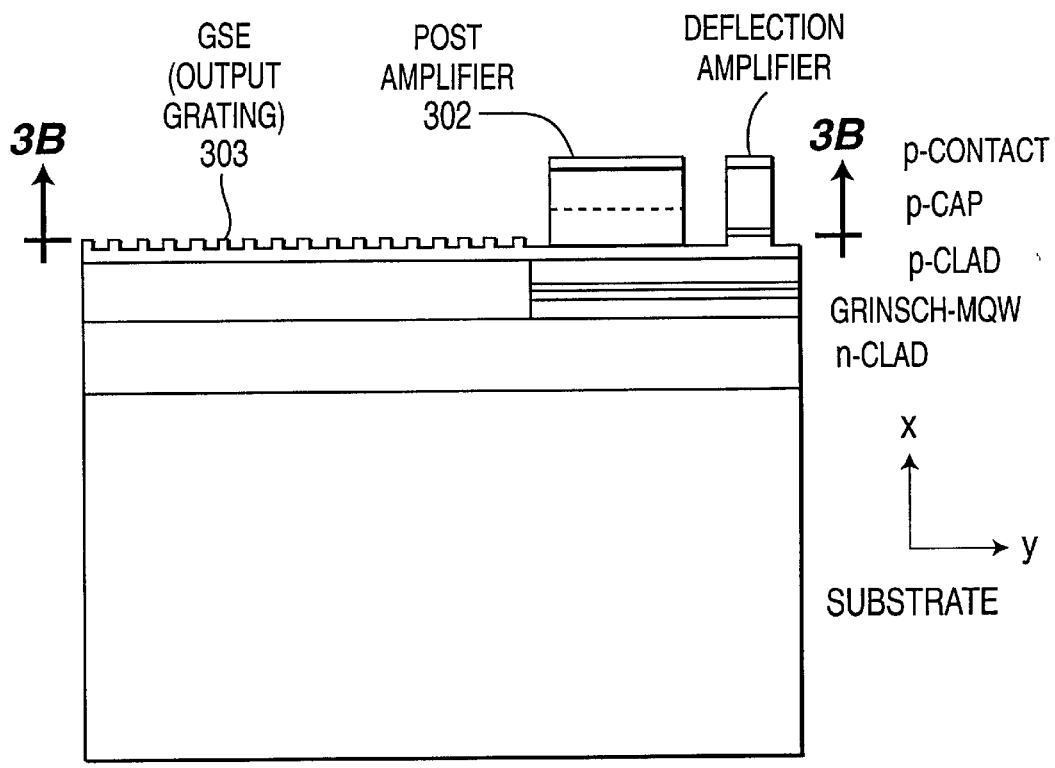
FIGS. 3A and 3B is a schematic drawing of another apparatus previously contemplated by the inventors' employer.
Figure 3B:
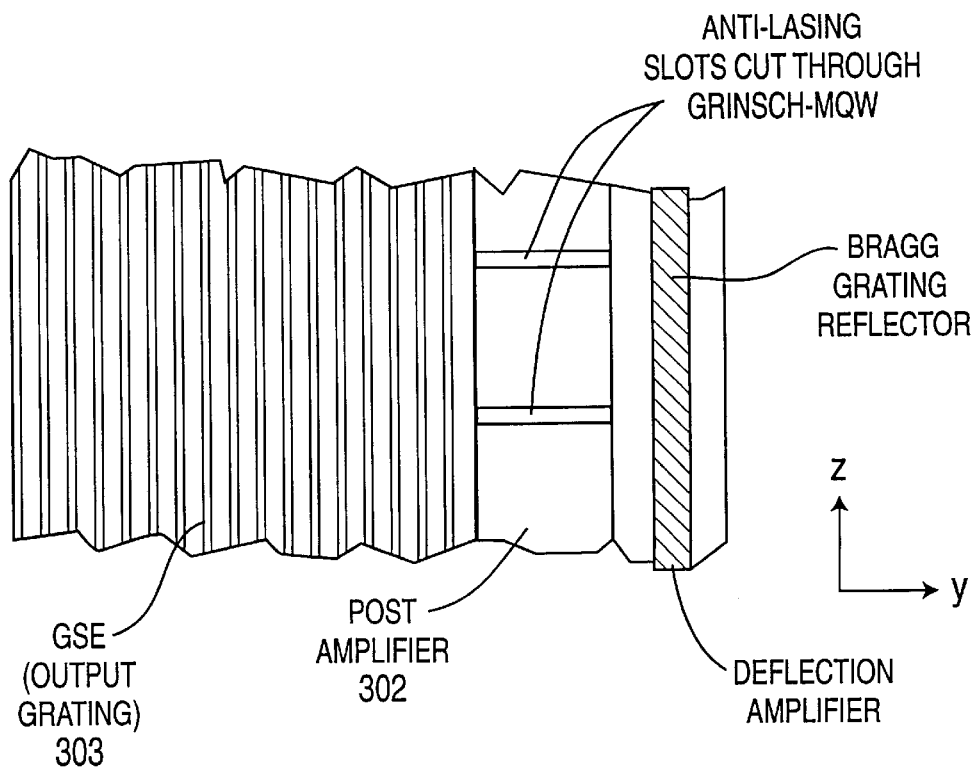
Figure 4:
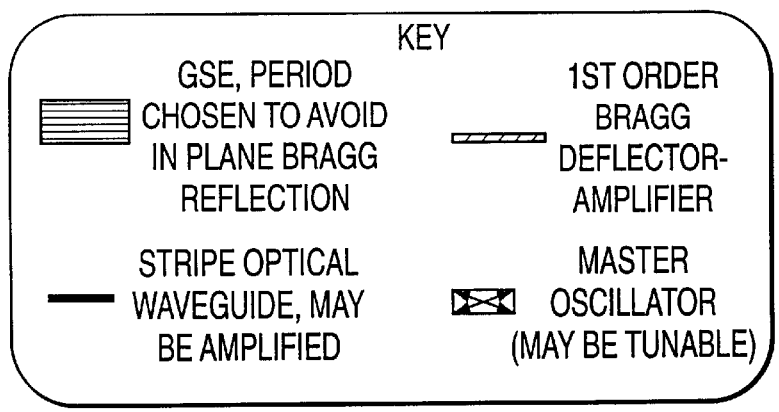
FIG. 4 is a schematic drawing of another apparatus previously contemplated by the inventors' employer.
Figure 4:
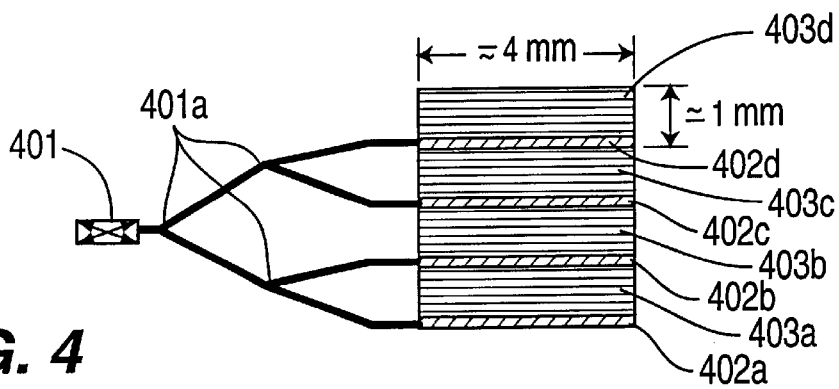
Figure 5:
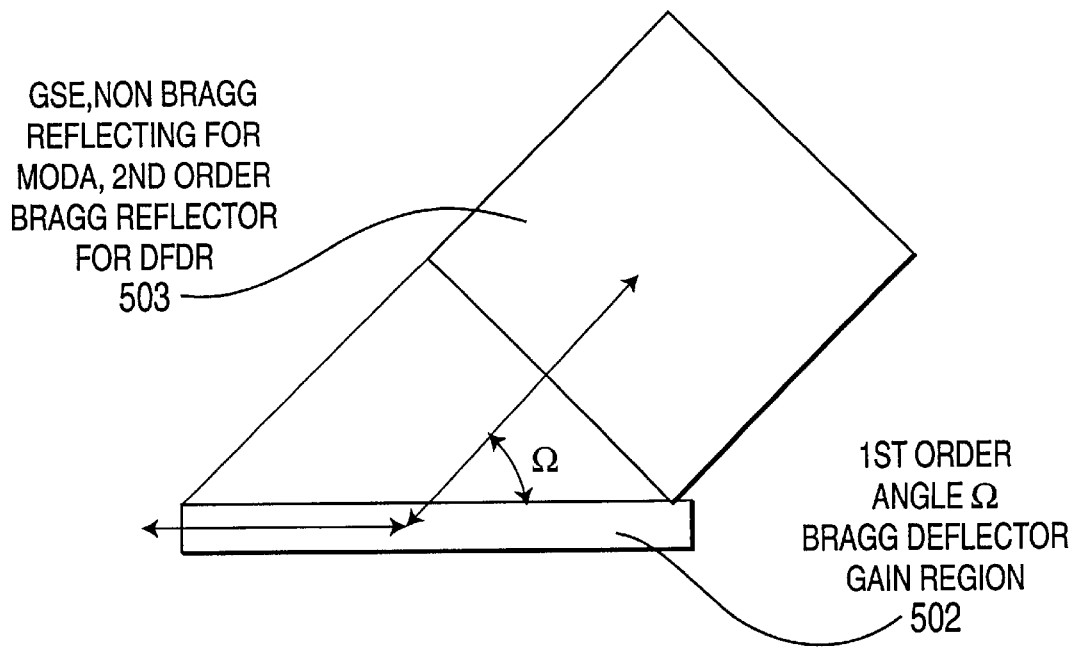
FIG. 5 is a schematic drawing of another apparatus previously contemplated by the inventors' employer.
Figure 6:
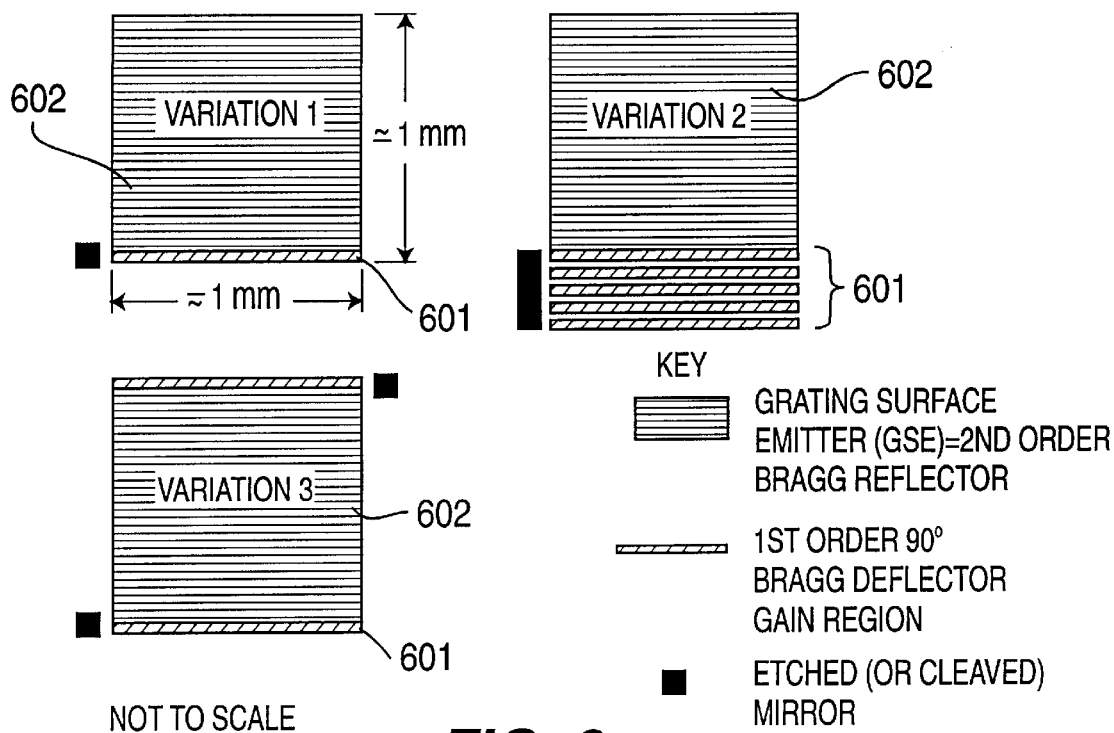
FIG. 6 is a schematic drawing of three apparatuses previously contemplated by the inventors' employer.

FIG. 11 shows the dependence of the coupling coefficient for TE to TE mode on angle β of FIG. 2.

Figure 12:
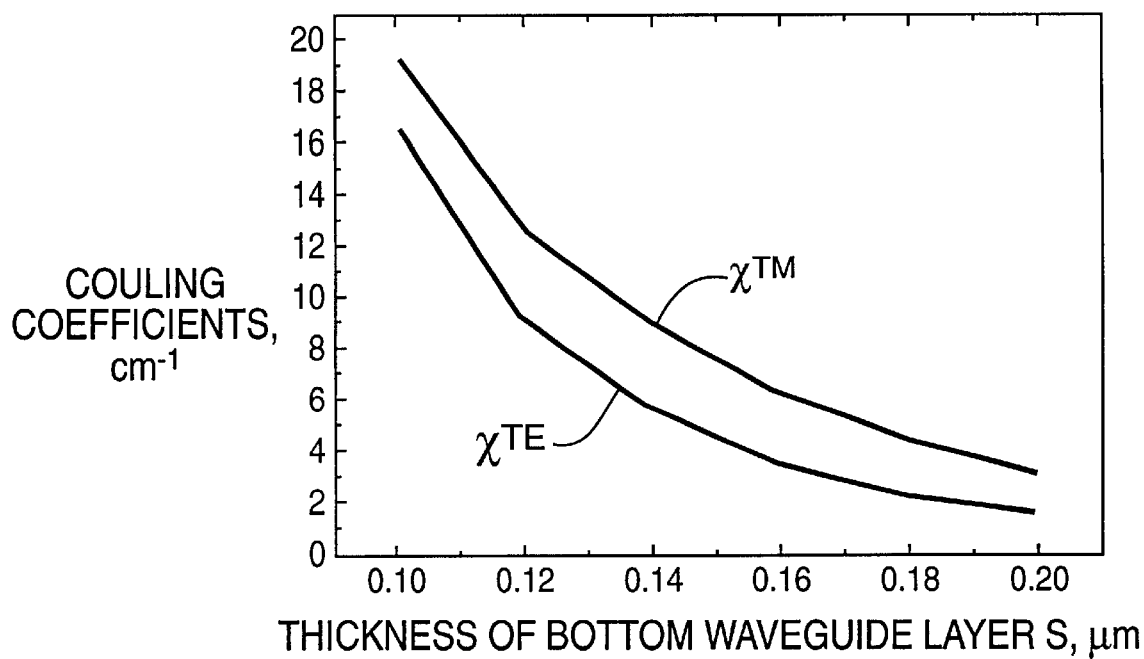
FIG. 12 is a graph of the coupling coefficients $\chi^{TE}$ and $\chi^{TM}$ as a function of the thickness of the waveguide layer.

FIG. 12 is a graph of the coupling coefficients $\chi^{TE}$ and $\chi^{TM}$ as a function of the thickness of the waveguide layer for a MOGCPA device according to an embodiment of the present invention. As can be seen from the graph, the coupling coefficients decrease as the thickness of the bottom waveguide layer increases, at least up to 0.20 μm.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. For example, different dimensions can be chosen within the specified constraints, different grating angles can be chosen, etc.

What is claimed is:

1. An apparatus comprising:
   (a) a single-mode master-oscillator region having a waveguide defined on a first end by a highly-reflective distributed Bragg reflector (DBR) mirror, and on a second end by a highly reflective DBR mirror, and having at least one semitransparent DBR mirror between the first end and the second end, the waveguide having a first longitudinal axis;
   (b) a first broad-contact amplifier section coupled to said single-mode-master-oscillator section by a first coupling grating disposed within the waveguide of said single-mode-master-oscillator region, and placed between said first end and said at least one semi-transparent DBR mirror, said broad contact amplifier including, an output side and a second longitudinal axis, the second longitudinal axis being at an angle approximately 90°–β to said first longitudinal axis, where β lies in a range between 0° and approximately 20°; and
   (c) a second broad-contact-amplifier section coupled to said single-mode-master-oscillator section by a coupling grating placed between said second end and said at least one semitransparent DBR mirror, said broad contact amplifier including an output side and a third longitudinal axis, the third longitudinal axis being at an angle approximately 90°–β' to said first longitudinal axis, where β' lies in a range between 0° and approximately 20°.

2. The apparatus of claim 1, wherein said first coupling grating is disposed across said amplifier section at an approximate angle 45°+β/2 to the first longitudinal axis.

3. The apparatus of claim 1, wherein said single-mode-master-oscillator section includes a waveguide with a bottom part that has a thickness of between approximately 0.10 microns and 0.20 microns, and wherein the waveguide has a top part adjacent to the coupling grating, the top part being between approximately 0.01 microns and 0.10 microns.

4. The apparatus of claim 3, wherein said single-mode-master-oscillator section further includes an aftergrating waveguide layer with a thickness between approximately 0.04 microns and approximately 0.16 microns.

* * * * *